(12) United States Patent
Kim et al.

(10) Patent No.: US 7,737,029 B2
(45) Date of Patent: Jun. 15, 2010

(54) METHODS OF FORMING METAL INTERCONNECT STRUCTURES ON SEMICONDUCTOR SUBSTRATES USING OXYGEN-REMOVING PLASMAS AND INTERCONNECT STRUCTURES FORMED THEREBY

(75) Inventors: Jae-hak Kim, Seoul (KR); Griselda Bonilla, Fishkill, NY (US); Steven E. Molis, Patterson, NY (US); Darryl D. Restaino, Modena, NJ (US); Hosadurga Shobha, Yorktown Heights, NY (US); Johnny Widodo, Singapore (SG)

(73) Assignees: Samsung Electronics Co., Ltd. (KR); International Business Machines Corporation, Armonk, NY (US); Chartered Semiconductor Manufacturing Ltd., Singapore (SG)

( * ) Notice: Subject to any disclaimer, the term of this patent is extended or adjusted under 35 U.S.C. 154(b) by 120 days.

(21) Appl. No.: 12/050,354

(22) Filed: Mar. 18, 2008

(65) Prior Publication Data

US 2009/0239374 A1 Sep. 24, 2009

(51) Int. Cl.
*H01L 21/321* (2006.01)
(52) U.S. Cl. .................. 438/638; 438/645; 438/687; 257/E21.579; 257/E21.496
(58) Field of Classification Search ................ 438/638, 438/645, 687; 257/E21.579, E21.496
See application file for complete search history.

(56) References Cited

U.S. PATENT DOCUMENTS

| | | | |
|---|---|---|---|
| 6,165,894 A | 12/2000 | Pramanick et al. | |
| 6,225,210 B1 | 5/2001 | Ngo et al. | |
| 6,333,248 B1 * | 12/2001 | Kishimoto | 438/586 |
| 6,383,925 B1 | 5/2002 | Ngo et al. | |
| 6,656,832 B1 | 12/2003 | Pan et al. | |
| 6,734,101 B1 * | 5/2004 | Bao et al. | 438/687 |
| 6,734,102 B2 | 5/2004 | Rathi et al. | |
| 6,764,940 B1 | 7/2004 | Rozbicki et al. | |
| 6,764,952 B1 | 7/2004 | Yu et al. | |
| 6,797,608 B1 | 9/2004 | Lin | |
| 6,797,642 B1 | 9/2004 | Chu et al. | |
| 6,875,694 B1 | 4/2005 | Ngo et al. | |
| 6,897,144 B1 * | 5/2005 | Ngo et al. | 438/627 |
| 6,897,147 B1 * | 5/2005 | Tsai et al. | 438/677 |
| 6,927,159 B2 | 8/2005 | Faust et al. | |
| 6,946,401 B2 | 9/2005 | Huang et al. | |

(Continued)

FOREIGN PATENT DOCUMENTS

KR 1020020053609 A 7/2002

(Continued)

*Primary Examiner*—George Fourson
(74) *Attorney, Agent, or Firm*—Myers Bigel Sibley & Sajovec

(57) ABSTRACT

Methods of forming devices include forming a first electrically insulating layer having a metal interconnection therein, on a substrate and then forming a first electrically insulating barrier layer on an upper surface of the metal interconnection and on the first electrically insulating layer. The first electrically insulating barrier layer is exposed to a plasma that penetrates the first electrically insulating barrier and removes oxygen from an upper surface of the metal interconnection. The barrier layer may have a thickness in a range from about 5 Å to about 50 Å and the plasma may be a hydrogen-containing plasma that converts oxygen on the upper surface of the metal interconnection to water.

18 Claims, 11 Drawing Sheets

U.S. PATENT DOCUMENTS

| | | |
|---|---|---|
| 7,037,835 B2 | 5/2006 | Lee et al. |
| 7,037,836 B2 | 5/2006 | Lee |
| 7,094,705 B2 | 8/2006 | Lin et al. |
| 7,122,484 B2 | 10/2006 | Perng et al. |
| 7,158,384 B2 | 1/2007 | Yim et al. |
| 7,163,889 B2 | 1/2007 | Yu et al. |
| 7,205,666 B2 | 4/2007 | Lee et al. |
| 7,232,766 B2 | 6/2007 | Bailey, III et al. |
| 7,239,017 B1 | 7/2007 | Yu et al. |
| 7,282,438 B1 | 10/2007 | Yu et al. |
| 2001/0049181 A1* | 12/2001 | Rathi et al. ................ 438/471 |
| 2003/0209738 A1* | 11/2003 | Ohto et al. .................. 257/257 |
| 2004/0161924 A1* | 8/2004 | Chen et al. .................. 438/637 |
| 2004/0175933 A1* | 9/2004 | Shishida et al. ............. 438/637 |

FOREIGN PATENT DOCUMENTS

| | | |
|---|---|---|
| KR | 1020030030268 A | 4/2003 |
| KR | 1020030052487 A | 6/2003 |

* cited by examiner

METHODS OF FORMING METAL INTERCONNECT STRUCTURES ON SEMICONDUCTOR SUBSTRATES USING OXYGEN-REMOVING PLASMAS AND INTERCONNECT STRUCTURES FORMED THEREBY

FIELD OF THE INVENTION

The present invention relates to semiconductor device fabrication methods and, more particularly, to methods of forming semiconductor devices with copper interconnects therein.

BACKGROUND OF THE INVENTION

Copper (Cu) has been used as an interconnection material in order to reduce the resistance of interconnections. In the case of forming a copper interconnection, a damascene process is generally used. In the damascene process, chemical mechanical polishing (CMP) may be performed, and after the CMP process is performed, a thin copper oxide film may be formed on the copper interconnection. A copper oxide film may be formed because it is difficult to completely intercept oxygen during the CMP process, and slurries used in the CMP process typically contain oxygen components. If a copper oxide film exists on the copper interconnection, the adhesion of the copper connection to a layer deposited on the copper interconnection may be degraded, and the interconnection resistance may be increased, thereby deteriorating the reliability of the semiconductor device.

Generally, in order to remove the copper oxide film, a plasma process may be performed with respect to a semiconductor substrate. If the plasma process is performed with respect to the semiconductor substrate, carbon components of an insulating layer may be removed by the plasma, and thus the carbon content of the insulating layer may be reduced. Also, a low dielectric material (i.e., a low-k material) that is mainly used as a material of the insulating layer may be porous and have a low mechanical solidity. Accordingly, when a plasma process is performed with respect to the insulating layer formed of a low-k material, the porosity of the insulating layer may be further increased if carbon is removed therefrom, and this increase in porosity may decrease the reliability of the semiconductor device.

Typically, in order to completely remove a copper oxide film, a long-time plasma process is required. However, as the plasma process is performed for a longer time, the thickness of the insulating layer being damaged by carbon removal becomes greater. Accordingly, if the plasma process is performed for a long time to completely remove the copper oxide film, the thickness of the damaged insulating layer, for example, may be about 1000 Å.

If the thickness of the damaged insulating layer is increased, then electron movement therein may occur and cause current leakage to neighboring interconnections. The porosity of the insulating layer may also be increased and thereby shorten the lifetime of the device. However, if the plasma process is weakly performed in order to reduce the thickness of the damaged insulating layer, the copper oxide layer may not be completely removed. Consequently, there is a need for a technique that can make the damaged insulating layer thin while completely removing the copper oxide layer.

SUMMARY OF THE INVENTION

Methods of forming an integrated circuit device according to embodiments of the present invention include forming a first electrically insulating layer having a metal interconnection therein, on a substrate, and forming a first electrically insulating barrier layer on an upper surface of the metal interconnection and on the first electrically insulating layer. The first electrically insulating barrier layer is exposed to a plasma that removes oxygen from an upper surface of the metal interconnection. According to preferred aspects of these embodiments, the first electrically insulating barrier layer has a thickness in a range from about 5 Å to about 50 Å and the plasma is a hydrogen-containing plasma that penetrates the barrier layer and converts oxygen on the upper surface of the metal interconnection to water, which out-diffuses from the barrier layer. The metal interconnection may be formed as a copper damascene pattern having a copper oxide layer thereon and the barrier layer may be at least one of SiN, SiC and SiCN.

Additional embodiments of the present invention include forming a first electrically insulating layer having a metal interconnection therein, on a substrate, and then removing oxygen from an upper surface of the metal interconnection by exposing the upper surface of the metal interconnection and the first electrically insulating layer to a first oxygen-removing plasma. Then, a first electrically insulating barrier layer may be formed on the upper surface of the metal interconnection and on the first electrically insulating layer. Additional oxygen may then be removed from the upper surface of the metal interconnection by exposing the first electrically insulating barrier layer to a second oxygen-removing plasma that converts oxygen on the upper surface of the metal interconnection to water, which out-diffuses through the insulating barrier layer. According to preferred aspects of these embodiments, the first oxygen-removing plasma comprises ammonia ($NH_3$) and the second oxygen-removing plasma comprises hydrogen. The step of exposing the first electrically insulating barrier layer to a second oxygen-removing plasma may be followed by forming a second electrically insulating barrier layer on the first electrically insulating barrier layer. These first and second electrically insulating barrier layers may be formed as SiN, SiC or SiCN layers.

According to additional embodiments of the present invention, a method of forming an integrated circuit device includes forming a first electrically insulating layer of SiCOH, on a semiconductor substrate, and then forming a metal interconnect comprising copper and a copper oxide region, within a recess in the first electrically insulating layer. A first electrically insulating barrier layer is then formed on an upper surface of the metal interconnect. At least a portion of the copper oxide region is then converted to copper metal by exposing the electrically insulating barrier layer to a hydrogen-containing plasma that transfers free hydrogen through the electrically insulating barrier layer to the copper oxide region. A second electrically insulating barrier layer is then formed on the first electrically insulating barrier layer. The first electrically insulating barrier layer may have a thickness in a range from about 5 Å to about 50 Å and the first electrically insulating layer may be a SiCOH layer. The combined thickness of the first and second electrically insulating barrier layers may also be greater than about 250 Å. In addition, the step of forming a first electrically insulating barrier layer on an upper surface of the metal interconnect may be preceded by exposing the copper oxide region to a plasma containing ammonia to thereby convert at least some of the copper oxide to copper.

BRIEF DESCRIPTION OF THE DRAWINGS

The above and other objects, features and advantages of the present invention will be apparent from the following detailed description taken in conjunction with the accompanying drawings, in which.

DETAILED DESCRIPTION OF THE PREFERRED EMBODIMENTS

Figure 1:
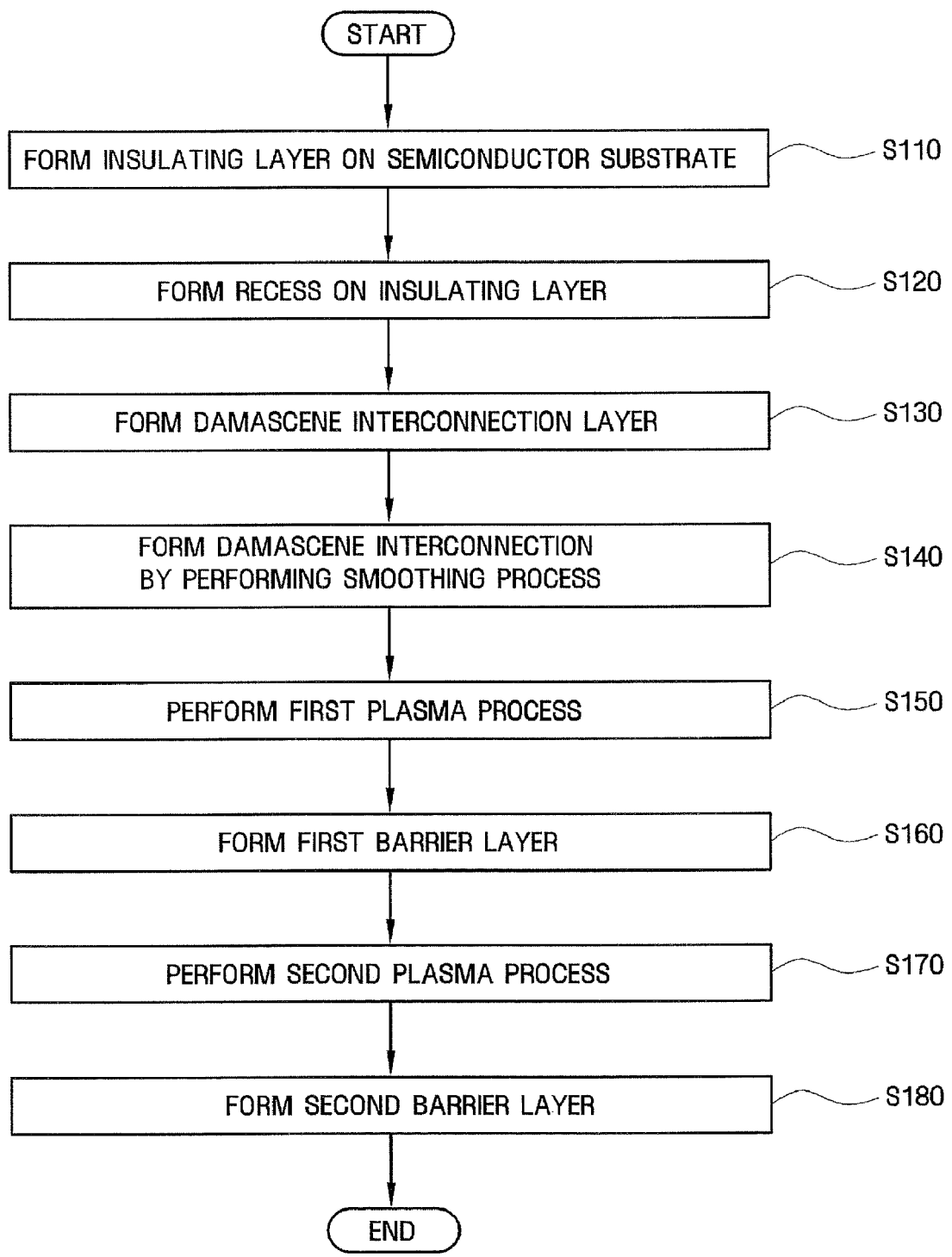
FIG. 1 is a flowchart illustrating a method of fabricating a semiconductor integrated circuit device according to an embodiment of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items.

It will be understood that, although the terms first, second, odd, even, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or odd element, component, region, layer or section discussed below could be termed a second or even element, component, region, layer or section without departing from the teachings of the present invention.

Spatially relative terms, such as "beneath," "below," "lower," "above," "upper," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. It also will be understood that, as used herein, the terms "row" or "horizontal" and "column" or "vertical" indicate two relative non-parallel directions that may be orthogonal to one another. However, these terms also are intended to encompass different orientations.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes," "including" and variants thereof, when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method of fabricating a semiconductor integrated circuit device according to embodiments of the present invention will be described with reference to the accompany drawings. FIG. 1 is a flowchart illustrating a method of fabricating a semiconductor integrated circuit device according to an embodiment of the present invention, and FIGS. 2 to 9 are sectional views successively explaining the method of fabricating a semiconductor integrated circuit device according to an embodiment of the present invention.

Figure 2:
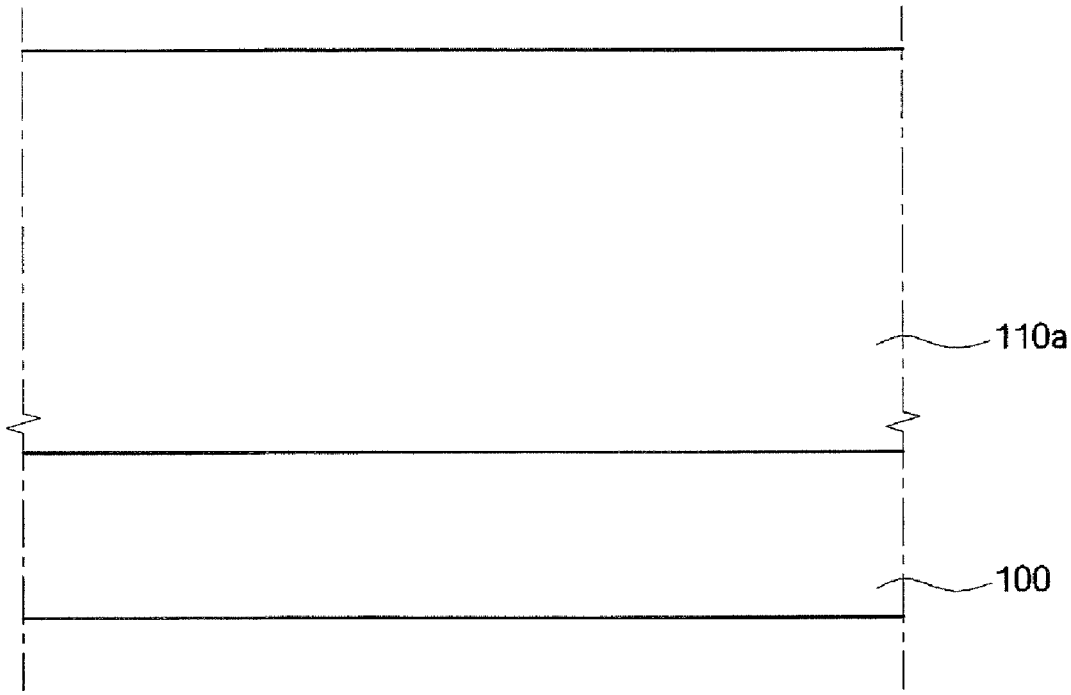
FIGS. 2 to 9 are cross-sectional views of intermediate structures that illustrate methods of fabricating semiconductor integrated circuit devices according to the embodiments of the present invention illustrated by FIG. 1.

Referring to FIGS. 1 and 2, an insulating layer 110a is formed on a semiconductor substrate 100 (Step S110). The semiconductor substrate 100 may be a silicon substrate, an SOI (Silicon On Insulator) substrate, a gallium arsenide (GaAs) substrate, a silicon germanium substrate, a ceramic substrate, a quartz substrate, or a glass substrate for a display, for example. Also, a P-type substrate or an N-type substrate may be used as the semiconductor substrate, but the P-type substrate is typically used. In this case, although not illustrated in the drawings, a P-type epitaxial layer may be grown on an upper part of the semiconductor substrate 100. And, although not illustrated in the drawings, the semiconductor substrate 100 may include a P-type well or an N-type well doped with p-type or n-type impurities. On the semiconductor substrate 100, transistors, contact holes, lower interconnections and other device structures (not shown) may be formed. The insulating layer 110a may be a silicon oxide layer such as $SiO_2$, and may be formed of a low dielectric (low-k) material. The low-k material may be a material having a dielectric constant k of about 3.0 or less, such as carbon containing silicon oxide (SiCOH).

Figure 3:
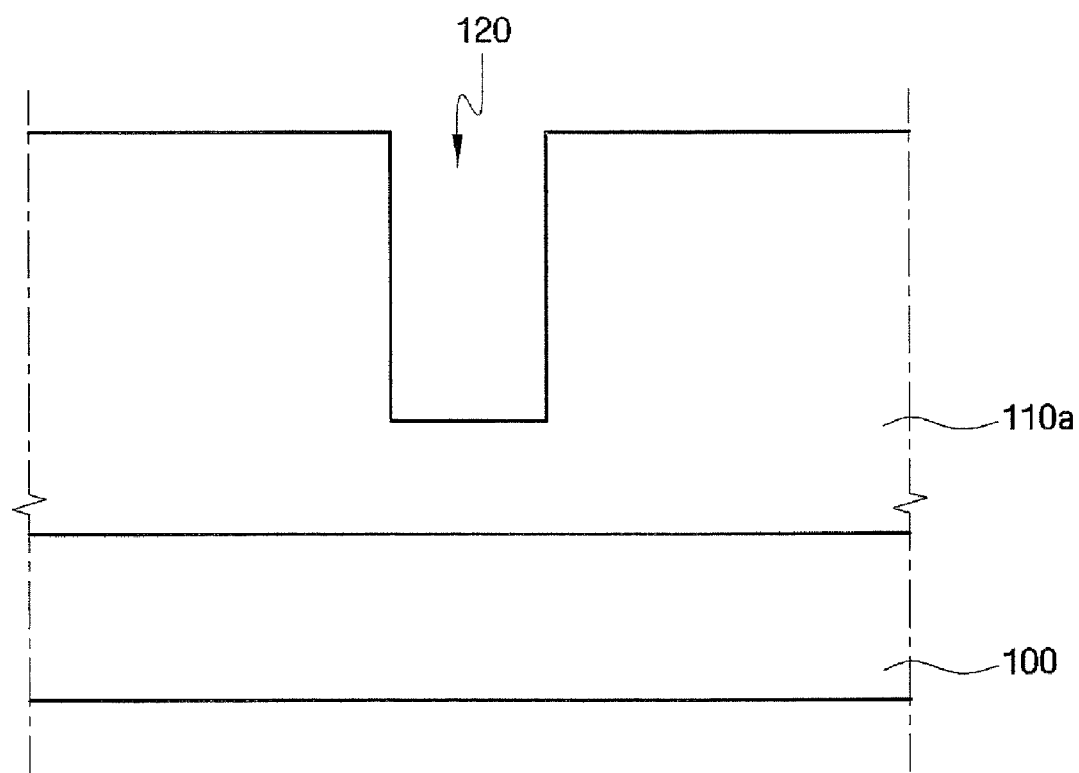

Then, as shown in FIGS. 1 and 3, a recess 120 is formed in the insulating layer 110a (Step S120). The recess 120 is formed by patterning a specified part of the insulating layer 110a, for example, by a photolithography process. Here, although the recess is in the form of a single damascene pattern in the drawing, it may be formed as a dual damascene interconnection in alternative embodiments of the invention.

Figure 4:
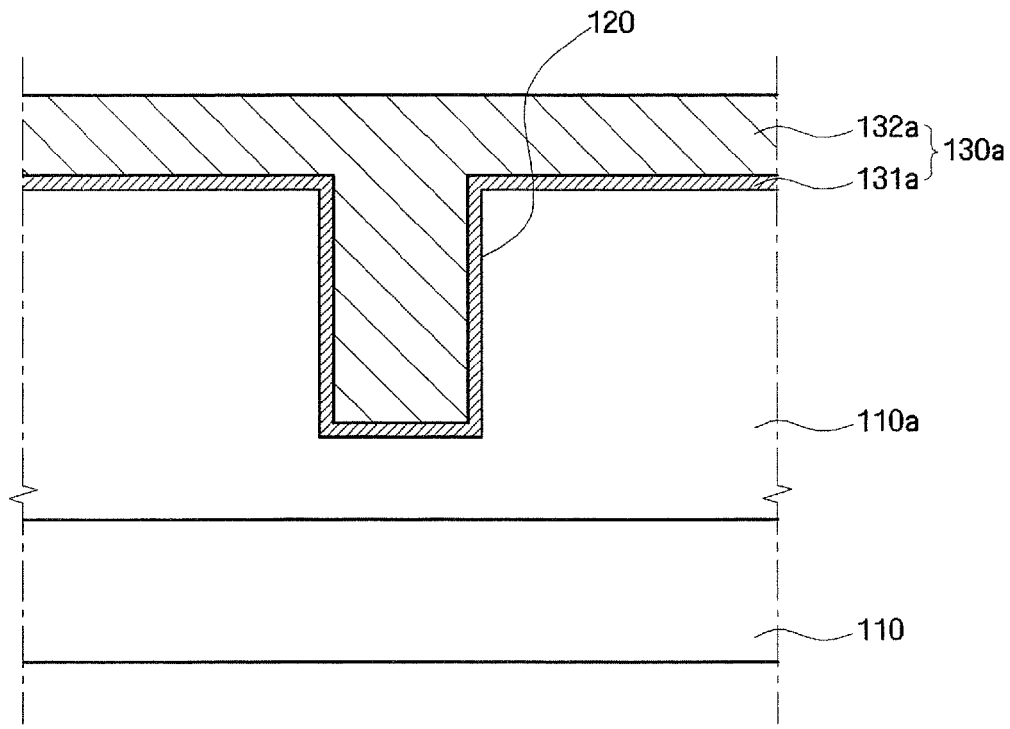

Then, as shown in FIGS. 1 and 4, a damascene interconnection layer 130a is formed so as to completely fill in the recess 120 (Step S130). In this case, the damascene interconnection layer 130a may include a first metal layer 131a and a second metal layer 132a. Specifically, the first metal layer 131a is conformally deposited on the insulating layer 110a, which includes a lower surface and side walls of the recess 120. The first metal layer 131a may be deposited, for example, by CVD (Chemical Vapor Deposition) or PVD (Physical Vapor Deposition). Also, the first metal layer 131a may be formed of titanium (Ti), tantalum (Ta), tungsten (W), or their nitride, such as TiN, TaN, WN. Alternatively, the first metal layer may be formed of TaSiN, WsiN or TiSiN. Here, the first metal layer 131a can act as a barrier layer by preventing metal atoms in the second metal layer 132a from being diffused into the surrounding insulating layer 110a.

Thereafter, a second metal layer 132a is deposited so as to completely fill in the recess 120. The second metal layer 132a may be made of copper or copper alloys, but is not limited thereto. The copper alloy may be obtained by mixing a very small amount of an element, for example, C, Ag, Co, Ta, In, Sn, Zn, Mn, Ti, Mg, Cr, Ge, Sr, Pt, Mg, Al, or Zr, in copper, but is not limited thereto. The second metal layer 132a may also be deposited by CVD or PVD. Although not illustrated in the drawing, a seed metal layer may be further formed on the first metal layer 131a, prior to deposition of the second metal layer 132a. The seed metal layer can increase the uniformity of the metal layer, and serve as an initial nucleation site. The seed metal may be copper, gold, silver, platinum (Pt), Palladium (Pd), but is not limited thereto.

Figure 5:
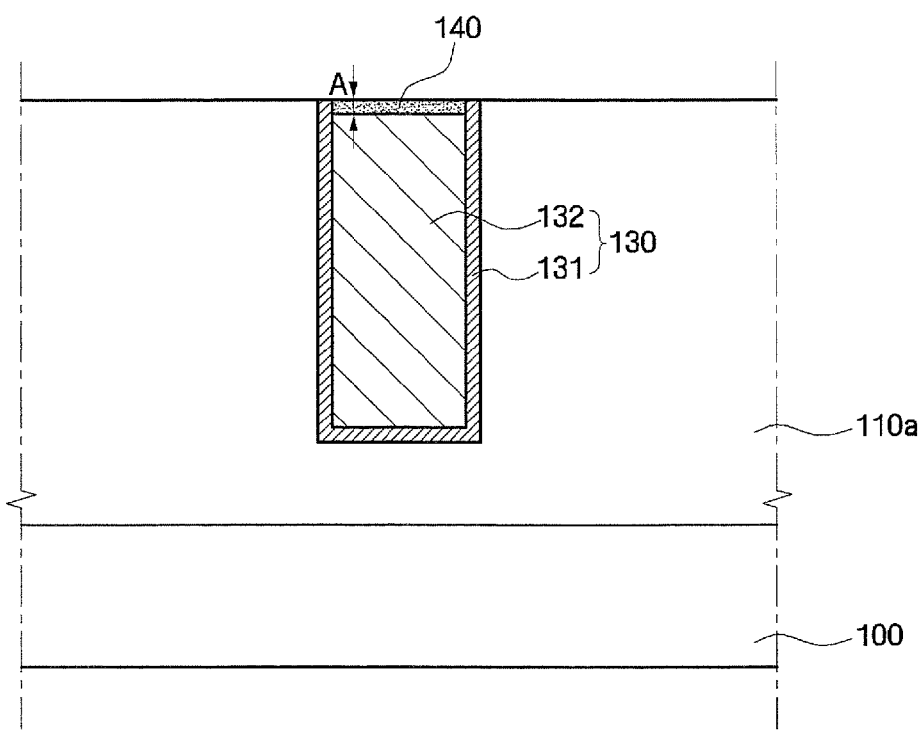

Then, as shown in FIGS. 1 and 5, a damascene interconnection 130 is formed through a smoothing process (Step S140). The damascene interconnection 130 may be formed by smoothing a damascene interconnection layer 130a until the upper surface of the insulating layer 110a is exposed. The smoothing of the damascene interconnection layer 130a may be performed, for example, by CMP (Chemical Mechanical Polishing). However, since it is difficult to completely shut out oxygen while performing the CMP, and oxygen components may be included in slurries for use in CMP, a thin metal oxide layer 140 may be formed on an upper surface of the damascene interconnection 130 during the step of smoothing the damascene interconnection layer 130a. In this case, the metal oxide layer 140 may be formed to a thickness A of about 50 Å. Particularly, in the case of forming the second metal layer 132a with copper or its alloys, a copper oxide layer such as $CuO_x$ may be formed as the thin metal oxide layer 140.

Figure 6:
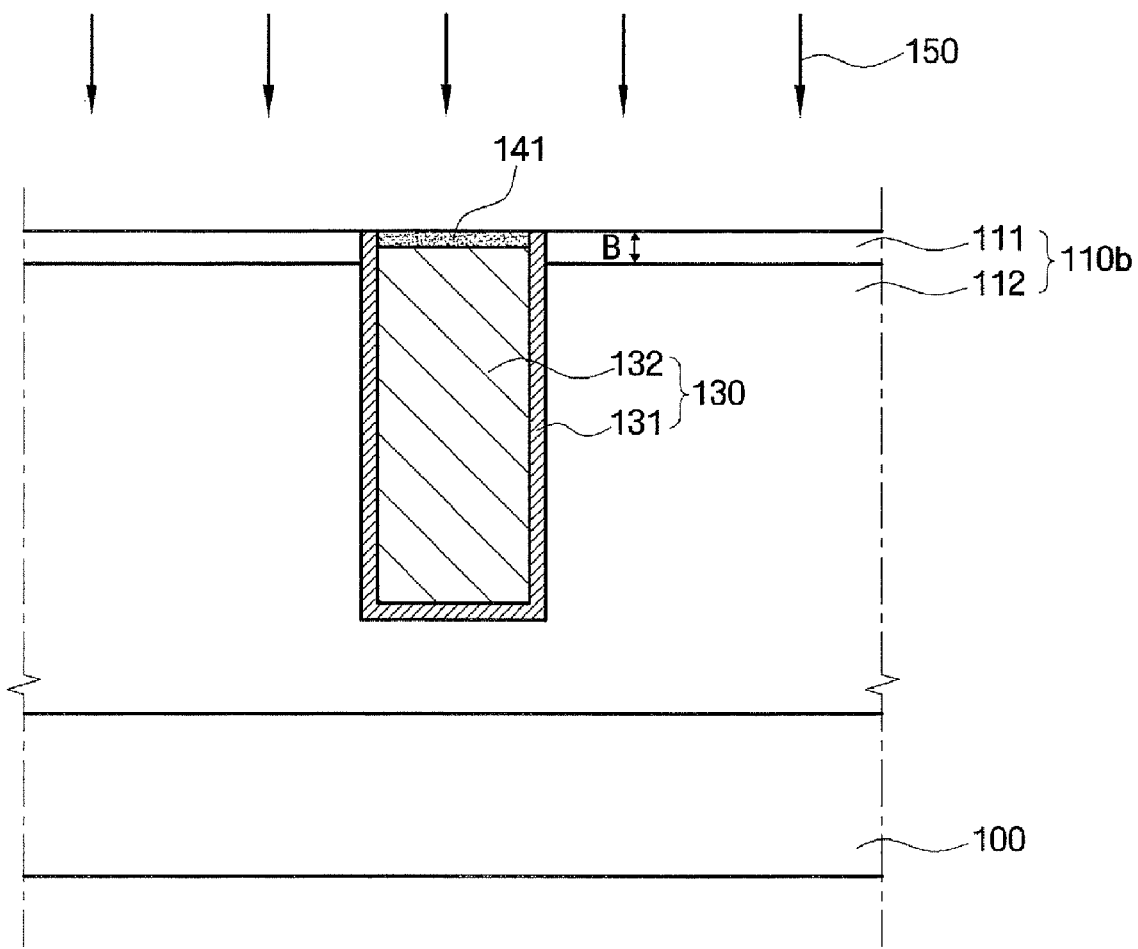

Then, as shown in FIGS. 1 and 6, a first plasma process 150 is performed with respect to the semiconductor substrate 100 on which the damascene interconnection 130 is formed (Step S150). Specifically, the semiconductor substrate 100, on which the damascene interconnection 130 is formed, is put in a plasma-processing device (not illustrated), and the first plasma process 150 is performed, for example, by injecting a gas including $NH_3$ into the device. When the first plasma process 150 is performed, a part of the metal oxide layer 140, formed on the upper side of the damascene interconnection 130, is deoxidized. About 50% to 90% of the metal oxide layer 140, and preferably at least about 33% of the metal oxide layer 140, may be deoxidized, to thereby yield an at least partially deoxidized metal oxide layer 141.

In addition, since the first plasma process 150 is performed not only with respect to the metal oxide layer 140, but is performed with respect to the entire semiconductor substrate 100, the first plasma process 150 may affect the insulating layer 110a formed on the semiconductor substrate 100 as shown in FIG. 5. Accordingly, in order to minimize the effect of the first plasma process 150 upon the insulating layer 110a, the first plasma process 150 is performed under weaker plasma conditions. For example, the plasma process 150 may be performed at a power of about 50 to 300 W for about 5 to 30 sec. In this case, the power and the processing time are complementary to each other. If a low power is supplied, the plasma process is performed for a relatively long time, while if a high power is supplied, the plasma process is performed for a relatively short time. For example, if a power of 50 W is supplied, the plasma is performed for about 30 sec.

After the completion of the first plasma process, the insulating layer 110a on the semiconductor substrate 100 may be divided into an upper region 111 and a lower region 112, to yield a modified insulating layer 110b. The upper region 111 indicates a region in which the insulating layer is damaged due to the first plasma process. Specifically, when the plasma, which is formed by using a gas including $NH_3$ reaches the surface of the insulating layer 110a, carbon atoms of the insulating layer 110a may be removed for the case where the insulating layer 110a is SiCOH. That is, during the plasma process, the carbon atoms of the upper region 111 may be removed, and thus the carbon content of the upper region 111 may be reduced. The removal of the carbon atoms may cause spaces to form in the upper region 111, and so the upper region 111 may become more porous than the lower region 112. However, since the metal oxide layer 140 is partly deoxidized under a weaker condition by the first plasma process, a thickness B of the upper region 111 of the damaged insulating layer 110a may be in a range from 50 Å to about 500 Å. Accordingly, the thickness of the damaged upper region 111 may be reduced to thereby improve the reliability of the device.

Figure 7:
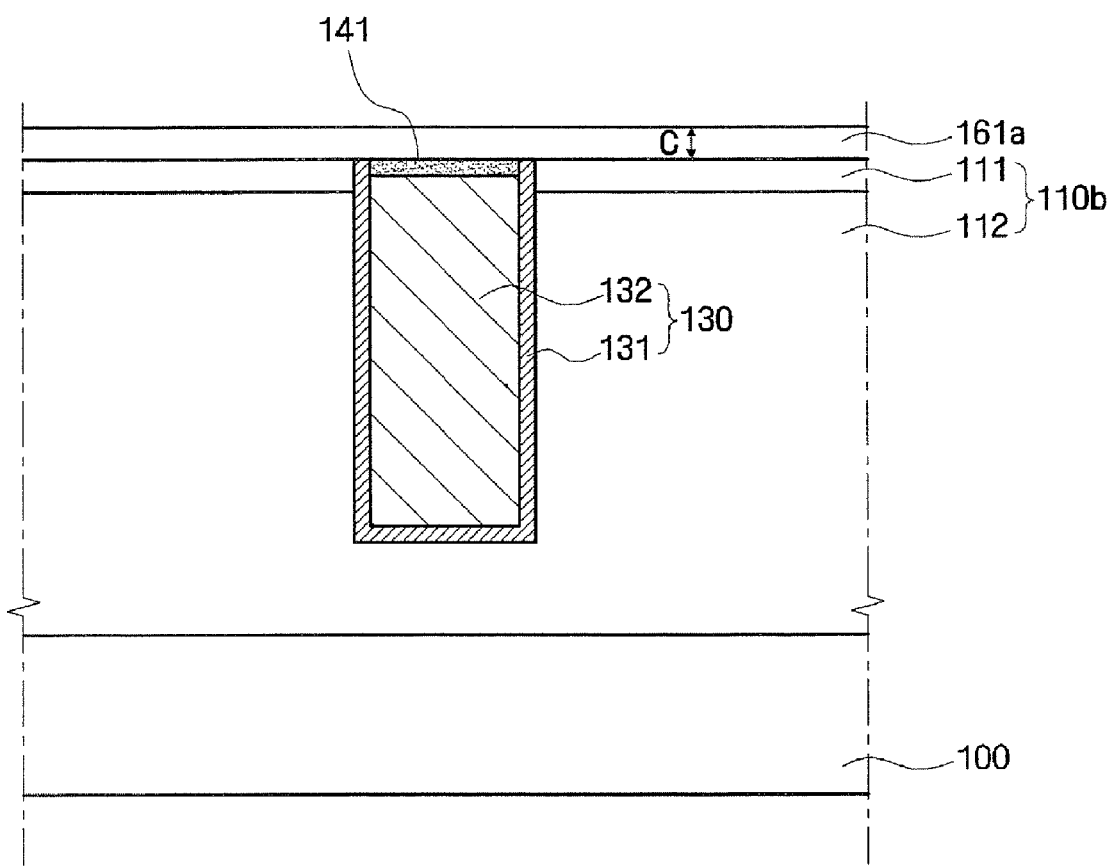

Thereafter, as shown in FIGS. 1 and 7, a first barrier layer 161a is formed on the damascene interconnection 130 and the insulating layer 110b (Step S160). The first barrier layer 161a may be formed by CVD or PECVD using a plasma deposition process. The first barrier layer 161a may be formed, for example, with silicon nitride (SiN), silicon carbide (SiC), or silicon carbon nitride (SiCN). The first barrier layer 161a may serve to provide electrical insulation to the damascene interconnection 130, or serve as a stopper in the etching process for forming another damascene interconnection (not illustrated). Although the first barrier layer 161a can protect the upper region 111 of the insulating layer while a second plasma process is performed, it is necessary for ions and radicals to pass through the first barrier layer 161a. Thus, the first barrier layer 161a has a thickness C, which is enough to prevent the upper region 111 of the insulating layer 110b from being damaged due to the second plasma process, but thin enough to allow ions and radicals to pass through the first barrier layer 161a during the second plasma process. The thickness C of the first barrier layer 161a may be about 5 to 50 Å, and be preferably about 20 Å.

Figure 8:
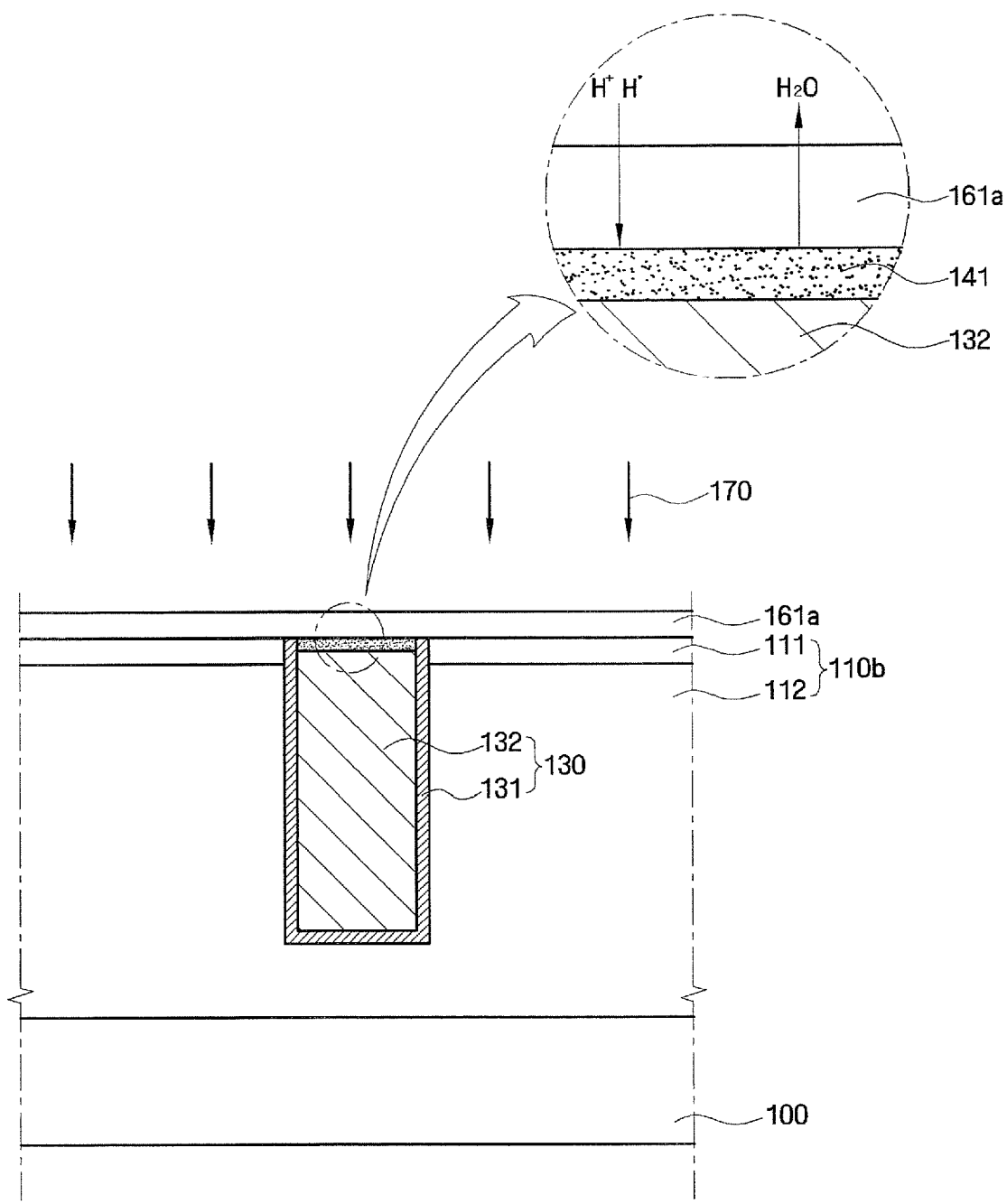

Then, as shown in FIGS. 1 and 8, the second plasma process 170 is performed with respect to the semiconductor substrate 100 on which the first barrier layer 161a is formed (Step S170). The semiconductor substrate 100, on which the first barrier layer 161a is formed, is put in a plasma processing device (not illustrated), and a second plasma process 170 is performed by injecting a gas including hydrogen. The hydrogen ions and hydrogen radicals included in the plasma pass through the first barrier layer 161a, and may completely deoxidize the metal oxide layer 141 on the damascene interconnection 130. At this time, H2O, which is a by-product of the interaction between the metal oxide layer 141 and hydrogen radicals, is discharged from the first barrier layer 161a. The second plasma process may be performed for about 10 to 60 sec. When the second plasma process is completed, the metal oxide layer 141 that exists between the damascene interconnection 130 and the first barrier layer 161a may be completely deoxidized.

Figure 9:
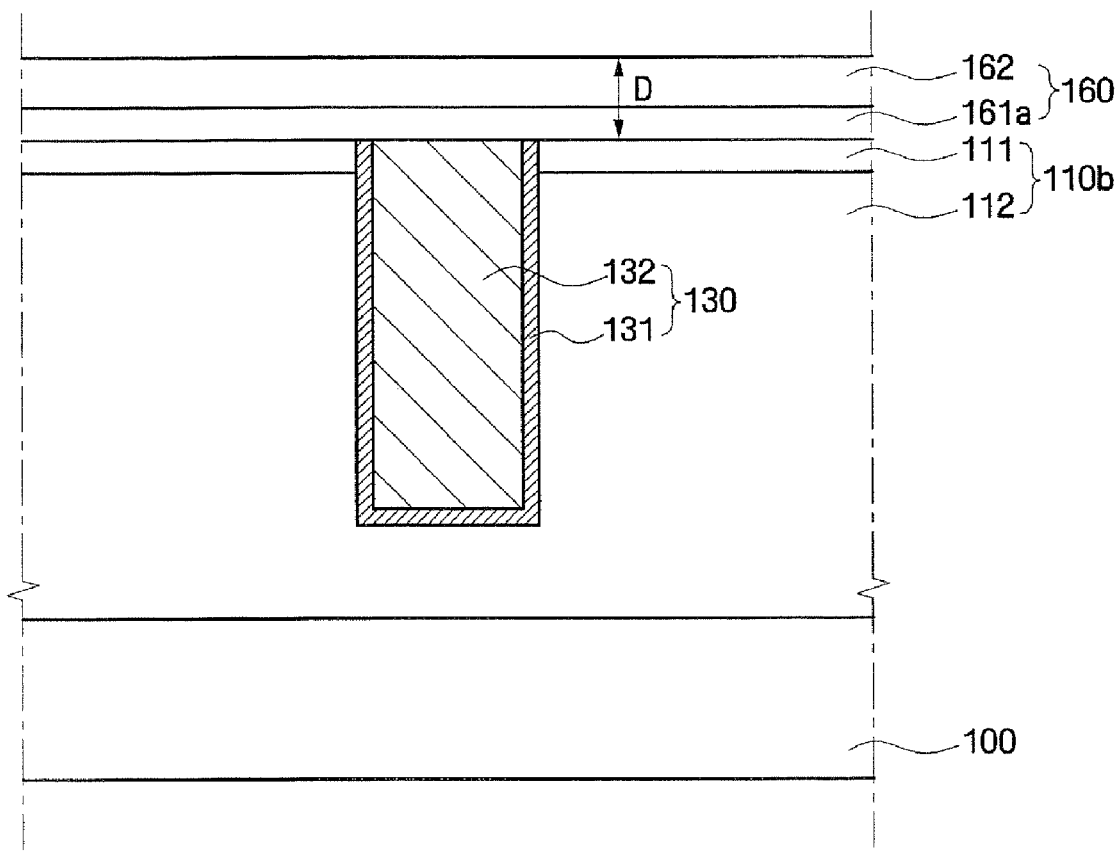

Then, as shown in FIGS. 1 and 9, a second barrier layer 162 is formed on the first barrier layer 161a (Step S180). The second barrier layer 162 may be made of substantially the same material as the first barrier layer 161. Also, the second barrier layer 162 may be formed by CVD or PECVD in the same manner as the first barrier layer 161.

In this case, if the thickness D of the barrier layer 160, including the first barrier layer 161a and the second barrier layer 162, is not sufficient, oxygen may pass through the barrier layer 160 and be injected into the damascene interconnection 130. Accordingly, it is desirable that the thickness D of the barrier layer 160 be sufficient to intercept the transmission of oxygen through the barrier layer 160. Accordingly, the second barrier layer 162 and the first barrier layer 161a are formed to a thickness of at least about 250 Å.

According to the method of fabricating a semiconductor integrated circuit device according to an embodiment of the present invention, the first plasma process is formed under weaker conditions, and the region in which the insulating layer is deoxidized can be reduced. Accordingly, leakage currents between adjacent interconnections can be reduced. In addition, by performing the plasma process twice, the metal oxide layer can be deoxidized so that the damage to the insulating layer is minimized. Therefore, the reliability of the semiconductor integrated circuit device can be improved.

Hereinafter, a semiconductor integrated circuit device according to an embodiment of the present invention will be described with reference to FIG. 9. Referring to FIG. 9, the semiconductor integrated circuit device according to an embodiment of the present invention includes a semiconductor substrate 100, an insulating layer 110b formed on the semiconductor substrate 100 and including a lower region 112 and an upper region 111 having a carbon content lower than that of the lower region 112 and having a thickness in the range of 50 to 500 Å. A damascene interconnection 130 is formed in the insulating layer 110b, and a barrier layer 160 formed on the damascene interconnection 130 and the insulating layer 110b. The insulating layer 111b may be divided into the upper region 111 and the lower region 112. As described above, the upper region 111 is a region from which carbon is removed by the first plasma process, and thus has a low carbon content and a high porosity in comparison to the lower region 112.

In the case where the first plasma process is performed under a weaker condition, the upper region 111 is formed to a thickness of about 50 to 500 Å. Accordingly, the thickness of the upper region 111 is reduced in comparison to the case that the entire metal oxide layer is removed by performing the first plasma process only, and thus the reliability of the device is further improved.

The barrier layer 160 includes the first barrier layer 161a and the second barrier layer 162, which are separately formed. Specifically, since the second plasma process for removing the metal oxide layer is performed after the first barrier layer 161a is formed, a discontinuous surface may exist between the first barrier layer 161a and the second barrier layer 162. In this case, the first barrier layer 161a and the second barrier layer 162 may be formed of substantially the same material.

Figure 10:
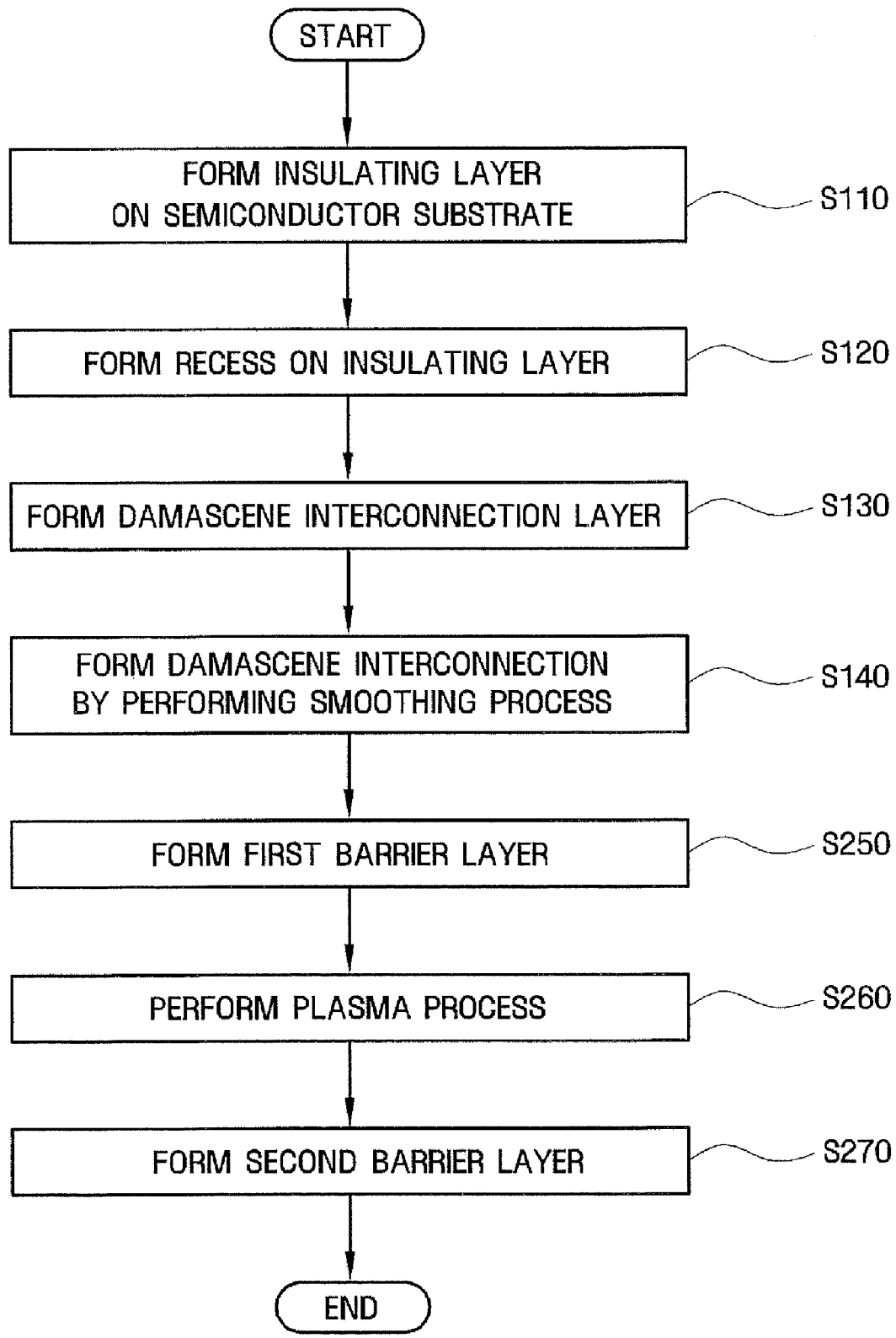
FIG. 10 is a flowchart illustrating a method of fabricating a semiconductor integrated circuit device according to an additional embodiment of the present invention.
Figure 11:
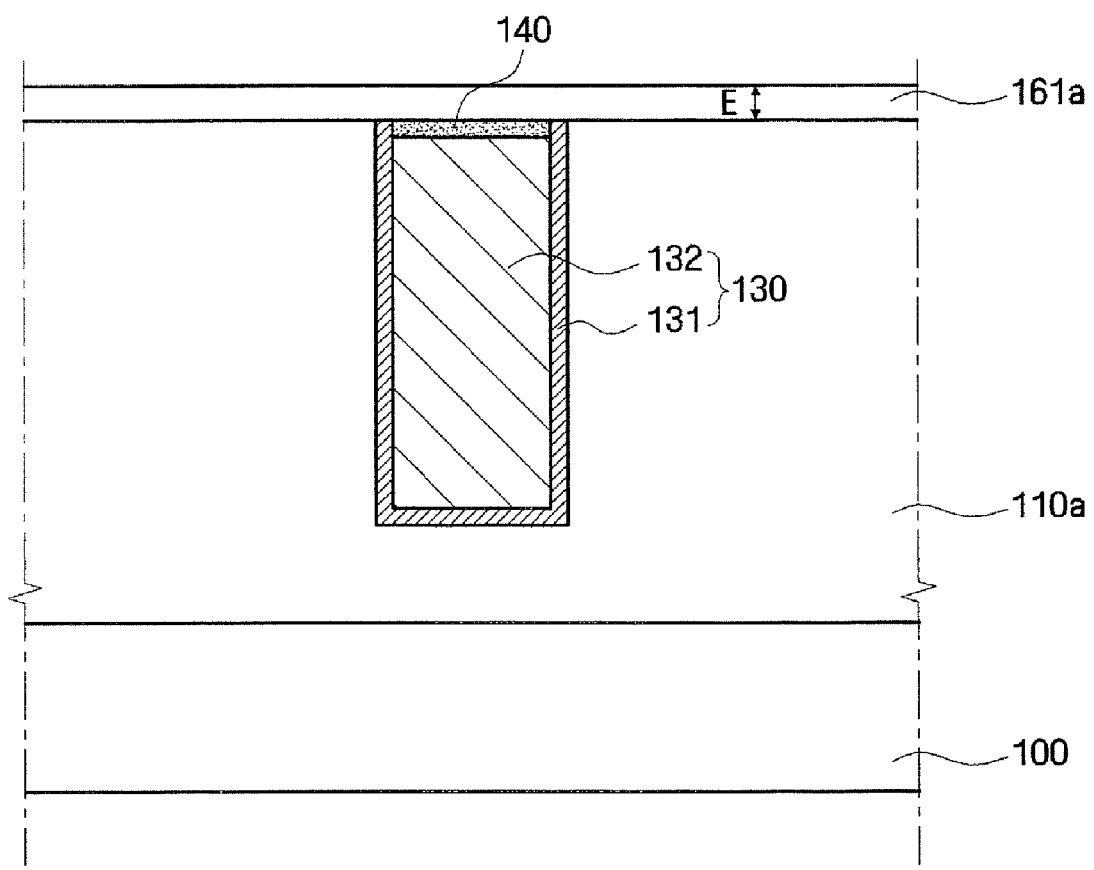
FIGS. 11 to 13 are cross-sectional views of intermediate structures that illustrate methods of fabricating semiconductor integrated circuit devices according to embodiments of the present invention illustrated by FIG. 10.
Figure 12:
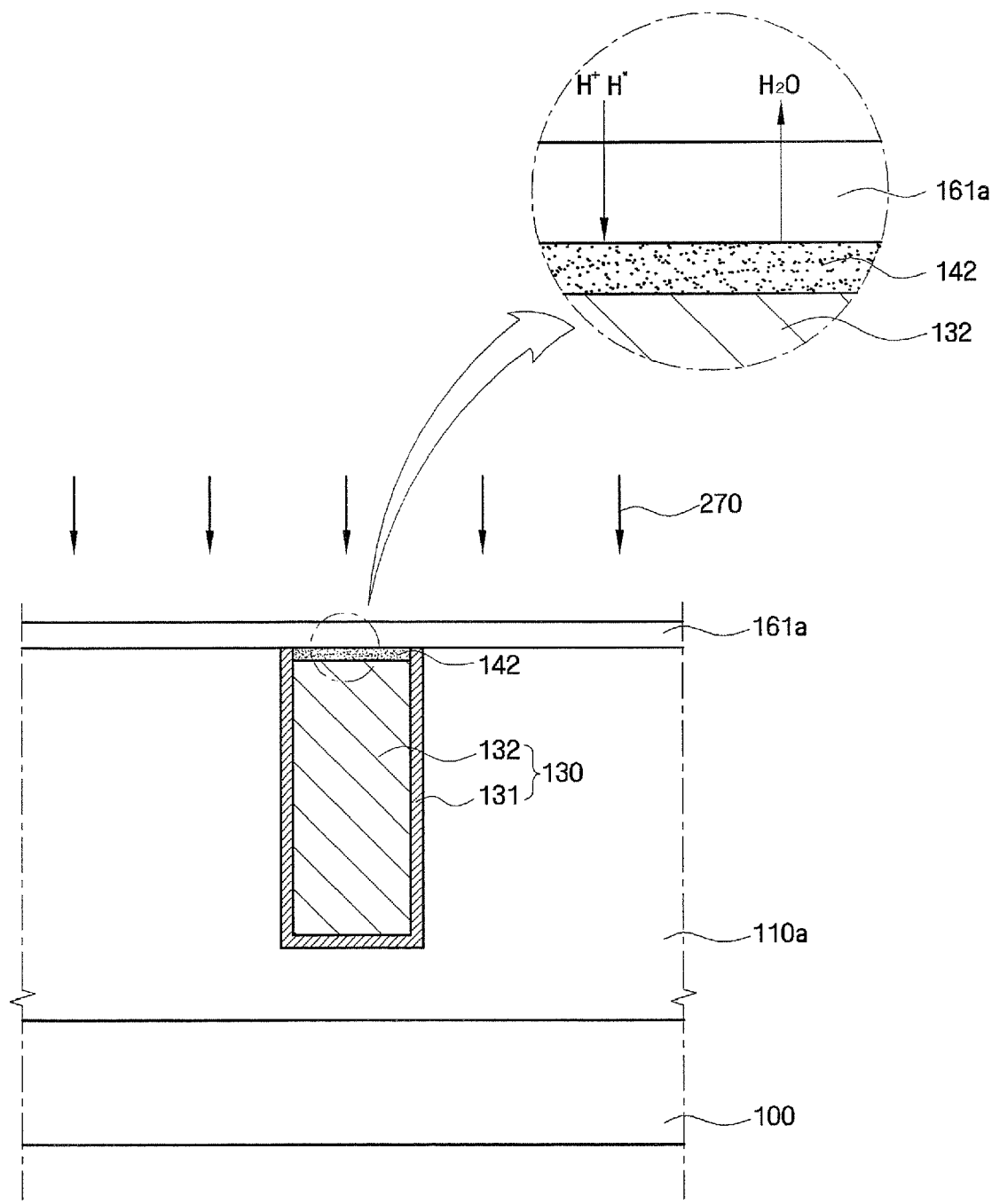
Figure 13:
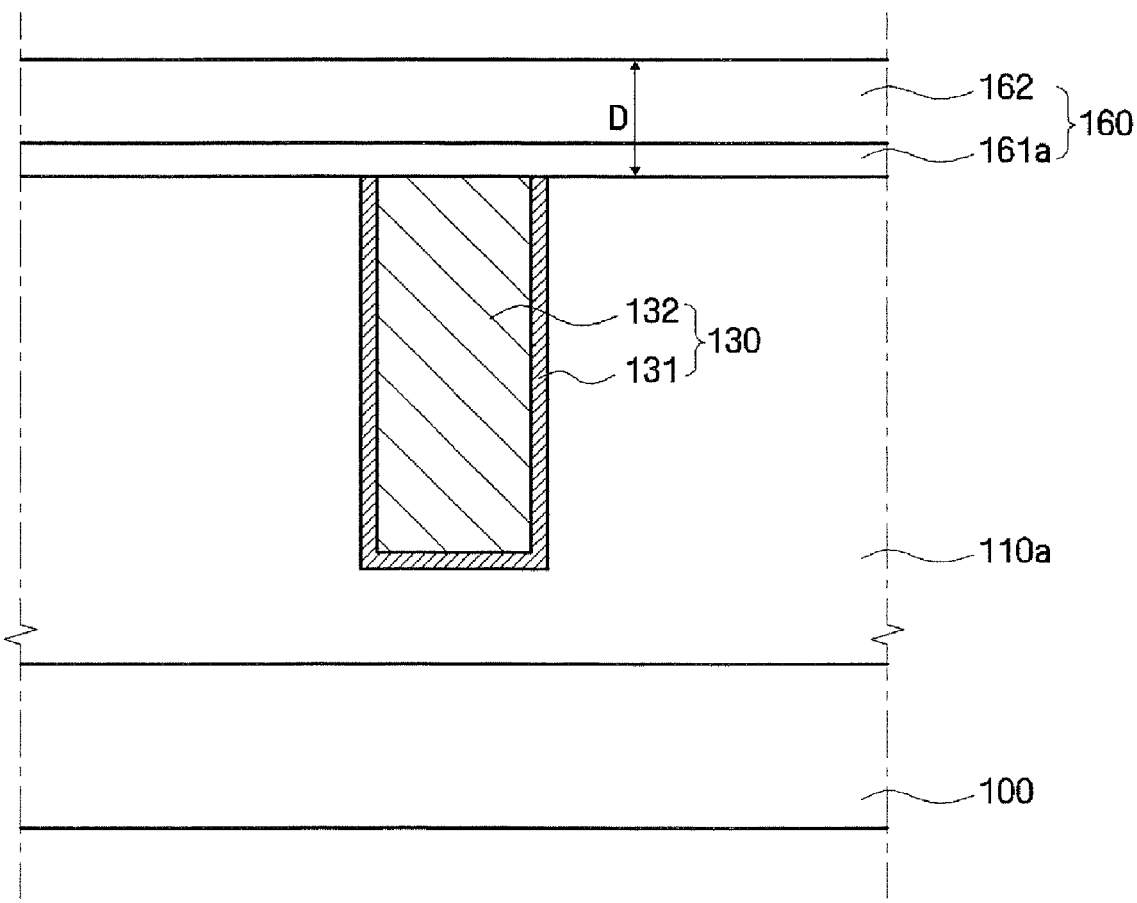

Hereinafter, a method of fabricating a semiconductor integrated circuit device according to another embodiment of the present invention will be described with reference to FIGS. 10 to 13. FIG. 10 is a flowchart illustrating a method of fabricating a semiconductor integrated circuit device according to another embodiment of the present invention, and FIGS. 11 to 13 are sectional views successively explaining the method of fabricating a semiconductor integrated circuit device of FIG. 10. In the following description of the present invention, the same drawing reference numerals are used for the same elements as illustrated in FIGS. 1 to 9, and the detailed description of the corresponding components has been omitted.

According to the method of fabricating a semiconductor integrated circuit device according to another embodiment of the present invention, the first barrier layer is formed without performing the first plasma process, unlike the method according to the embodiment of the present invention described by FIGS. 1-9. Since the steps performed before Step S250 are the same as those in an embodiment of the present invention, only the subsequent steps will be described.

Referring to FIGS. 10 and 11, an insulating layer 110a is formed on a semiconductor substrate 100 (Step S110). A recess 120 is formed on the insulating layer (Step S120) and then a damascene interconnection layer 130a is formed so as to completely fill in the recess (Step S130). Then, a damascene interconnection 130 is formed by performing a smoothing process (Step S140) and a first barrier layer 161a is formed on the damascene interconnection 130 and the insulating layer 110a (Step S250).

Specifically, the first barrier layer 161a is thinly deposited on the insulating layer 110a in which the damascene interconnection 130 and the metal oxide layer 140 are formed. At this time, the first barrier layer 161a may be formed by CVD or PECVD. The first barrier layer 161a may be formed, for example, of silicon nitride (SiN), silicon carbide (SiC), or silicon carbon nitride (SiCN). The first barrier layer 161a may serve to provide electrical insulation to the damascene interconnection 130, or serve as a stopper in the etching process for forming another damascene interconnection (not illustrated).

The first barrier layer 161a has a thickness E sufficient to prevent the insulating layer 110b from being damaged due to the plasma process, and to allow ions and radicals (e.g., hydrogen radicals) to pass through the first barrier layer 161a during the plasma process. The thickness E of the first barrier layer 161a may be in the range of about 5 to 50 Å, and be preferably about 20 Å.

Then, as shown in FIGS. 10 and 12, the plasma process is performed (Step S260). The semiconductor substrate 100, on which the first barrier layer 161 is formed, is put in a plasma processing device (not illustrated), and a plasma process 270 is performed, for example, by injecting a gas including hydrogen. Hydrogen ions and hydrogen radicals created by the plasma process 270 pass through the first barrier layer 161a, and deoxidize a metal oxide layer 142 formed on an upper part of the damascene interconnection 130. At this time, H2O, which is a by-product of the interaction between hydrogen and the metal oxide in the metal oxide layer 142, is discharged out of the first barrier layer 161a. The plasma process is performed for a sufficient time, and thus the metal oxide layer 142 may be completely removed (i.e., completely deoxidized).

Then, as shown in FIGS. 10 and 13, a second barrier layer 162 is formed on the first barrier layer 161a (Step S250). The second barrier layer 162 may be made of substantially the same material as the first barrier layer 161a. Also, the second barrier layer 162 may be formed by CVD or PECVD in the same manner as the first barrier layer 161a.

In this case, if the thickness D of the barrier layer 160 including the first barrier layer 161a and the second barrier layer 162 is not sufficient, oxygen may pass through the barrier layer 160 and a metal oxide layer may be formed again on the damascene interconnection 130. Accordingly, the thickness D of the barrier layer 160 should be about 250 Å or more. Thus, the second barrier layer 162 and the first barrier layer 161a are formed to a combined thickness of about 250 Å or more.

According to the method of fabricating a semiconductor integrated circuit device according to another embodiment of the present invention, the plasma process is formed after the damascene interconnection is formed and the first barrier layer is deposited, and the first barrier layer protects the insulating layer during the plasma process. That is, the first barrier layer inhibits the damage of the insulating layer due to the plasma by intercepting the direct contact of the plasma with the insulating layer, and thus the reliability of the semiconductor integrated circuit device is improved.

Thus, the semiconductor integrated circuit device of FIG. 13 includes a semiconductor substrate 100, an insulating layer 110a formed on the semiconductor substrate 100, a damascene interconnection 130 formed in the insulating layer 110a, a first barrier layer 161a formed on the damascene interconnection 130 and the insulating layer 110a, and a second barrier layer 162 discontinuously formed on the first barrier layer 161a using the same material as the first barrier layer 161a. The first barrier layer 161a is formed to a thickness of about 5 to 50 Å. Since the plasma process is performed after the first barrier layer 161a is formed, a discontinuous surface may exist between the first barrier layer 161a and the second barrier layer 162. In this case, the first barrier layer 161a and the second barrier layer 162 may be formed of substantially the same material. For example, the first barrier layer 161a and the second barrier layer may be formed of silicon nitride (SiN), silicon carbide (SiC), or silicon carbon nitride (SiCN).

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of forming an integrated circuit device, comprising:
    forming a first electrically insulating layer having a metal interconnection therein, on a substrate;
    removing oxygen from an upper surface of the metal interconnection by exposing the upper surface of the metal interconnection and the first electrically insulating layer to a first oxygen-removing plasma; then
    forming a first electrically insulating barrier layer on the upper surface of the metal interconnection and on the first electrically insulating layer; and
    removing oxygen from the upper surface of the metal interconnection by exposing the first electrically insulating barrier layer to a second oxygen-removing plasma.

2. The method of claim 1, wherein the first oxygen-removing plasma comprises ammonia ($NH_3$).

3. The method of claim 2, wherein the second oxygen-removing plasma comprises hydrogen.

4. The method of claim 1, wherein the second oxygen-removing plasma comprises hydrogen.

5. The method of claim 1, wherein exposing the first electrically insulating barrier layer to a second oxygen-removing plasma is followed by forming a second electrically insulating barrier layer on the first electrically insulating barrier layer.

6. The method of claim 5, wherein the first and second electrically insulating barrier layers comprise materials selected from a group consisting of SiN, SiC and SiCN.

7. The method of claim 1, wherein the first electrically insulating barrier layer has a thickness in a range from about 5 Å to about 50 Å.

8. A method of forming an integrated circuit device, comprising:
    forming a first electrically insulating layer having a metal interconnection therein with a native metal oxide layer on the metal interconnection, on a substrate;
    forming a first electrically insulating non-oxide barrier layer directly on an upper surface of the native metal oxide layer and directly on the first electrically insulating layer; and
    exposing the first electrically insulating barrier layer to a plasma that removes oxygen from an upper surface of the native metal oxide layer.

9. A method of forming an integrated circuit device, comprising:
    forming a first electrically insulating layer having a metal interconnection therein, on a substrate;
    forming a first electrically insulating barrier layer on an upper surface of the metal interconnection and on the first electrically insulating layer, said first electrically insulating layer comprising at least one of SiN, SiC and SiCN; and
    exposing the first electrically insulating barrier layer to a plasma that removes oxygen from an upper surface of the metal interconnection.

10. The method of claim 9, wherein the metal interconnection comprises a copper damascene pattern having a copper oxide layer thereon.

11. The method of claim 9, wherein the first electrically insulating barrier layer has a thickness in a range from about 5 Å to about 50 Å; and wherein said exposing step comprises exposing the first electrically insulating barrier layer to a hydrogen-containing plasma.

12. A method of forming an integrated circuit device, comprising:
- forming a first electrically insulating layer comprising SiCOH, on a semiconductor substrate;
- forming a metal interconnect comprising copper and a copper oxide region, in the first electrically insulating layer;
- forming a first electrically insulating barrier layer on an upper surface of the metal interconnect; and
- converting at least a portion of the copper oxide region to copper metal by exposing the electrically insulating barrier layer to a hydrogen-containing plasma that transfers free hydrogen through the electrically insulating barrier layer to the copper oxide region; and then
- forming a second electrically insulating barrier layer on the first electrically insulating barrier layer.

13. The method of claim 12, wherein the first electrically insulating barrier layer has a thickness in a range from about 5 Å to about 50 Å.

14. The method of claim 12, wherein the first electrically insulating layer comprises SiCOH.

15. The method of claim 12, wherein the first and second electrically insulating barrier layers comprise a material selected from a group consisting of SiN, SiC and SiCN.

16. The method of claim 15, wherein a combined thickness of the first and second electrically insulating barrier layers is greater than about 250 Å.

17. The method of claim 12, wherein forming a first electrically insulating barrier layer on an upper surface of the metal interconnect is preceded by exposing the copper oxide region to a plasma containing ammonia.

18. The method of claim 12, wherein forming a metal interconnect comprises chemically-mechanically polishing a copper layer using a slurry having components therein that oxidize copper.

* * * * *